United States Patent [19]

Meterko et al.

[11] Patent Number: 5,077,382
[45] Date of Patent: Dec. 31, 1991

[54] COPOLYIMIDE ODPA/BPDA/4,4'-ODA OR P-PDA

[75] Inventors: Timothy A. Meterko, Buffalo; Rudolph F. Mundhenke, N. Tonawanda; Willis T. Schwartz, Gr. Island, all of N.Y.

[73] Assignee: Occidental Chemical Corporation, Niagara Falls, N.Y.

[21] Appl. No.: 427,286

[22] Filed: Oct. 26, 1989

[51] Int. Cl.$^5$ .............................................. C08G 69/26
[52] U.S. Cl. ................................... 528/353; 528/188; 528/189; 525/432
[58] Field of Search ..................... 528/188, 189, 353; 525/432

[56] References Cited

U.S. PATENT DOCUMENTS

| | | | |
|---|---|---|---|
| 3,416,994 | 12/1968 | Chalmers et al. | 525/432 |
| 3,520,837 | 7/1970 | Wilson | 528/188 |
| 3,528,950 | 9/1970 | Lubowitz | 528/353 |
| 3,959,350 | 5/1976 | Rogers | 528/353 |
| 4,247,443 | 1/1981 | Sasaki et al. | 528/341 |
| 4,290,936 | 9/1981 | Sasaki et al. | 528/183 |
| 4,537,947 | 8/1985 | D'Alelio | 525/432 |

FOREIGN PATENT DOCUMENTS 63-264121  11/1988  Japan ........................ 53/22

Primary Examiner—John Kight, III
Assistant Examiner—Kathryne E. Shelborne
Attorney, Agent, or Firm—James F. Tao; John H. Engelmann

[57] ABSTRACT

A co-polyimide based upon a mixture of 4,4'-oxydiphthalic dianhydride (ODPA) and 3,4,3',4'-biphenyltetracarboxylic dianhydride (BPDA) as the dianhydride component and either 4,4'-oxydianiline (ODA) or paraphenylene diamine as the amine component is disclosed. The molar ratio between the ODPA and BPDA ranges from 3:1 to 1:3. The co-polyimide may either be formed as a random copolymer, or as a block copolymer where the blocks are based upon blocks of polymer containing ODPA and blocks of polymer containing BPDA provided that the molar ratios of ODPA and BPDA are in the ratio of 3:1 to 1:3.

12 Claims, No Drawings

COPOLYIMIDE ODPA/BPDA/4,4'-ODA OR P-PDA

BACKGROUND OF THE INVENTION

This invention relates to polyimide copolymers prepared by the reaction of a mixture of dianhydrides reacting with a diamine. More specifically, it relates to polyimide copolymers prepared from a mixture of 4,4'-oxydiphthalic dianhydride (ODPA) and 3,4,3',4'-biphenyltetracarboxylic dianhydride (BPDA) and either 4,4'-oxydianiline (ODA) or p-phenylenediamine.

Dianhydrides, such as ODPA, may be reacted with diamines to form polyimide resins. The formation of the polymer is a two step process. In the first step, the dianhydride reacts with the diamine to form a polyamic acid which generally remains in solution. The polyamic acid solution is then subjected to a curing process which includes heat. The solvent evaporates, and the polyamic acid releases water to form the final polyimide. Chemical methods of curing are also available.

There are several methods for forming objects from polyimides. For example, the polyamic acid solution may be spread on a surface and cured to form a film. The surface need not be flat. Alternatively, the polyamic acid solution may be cured to form the polyimide which may then be subjected to heat and pressure to form objects.

Polyimides were first prepared by T. M. Bogert, et al, J. Am. Chem. Soc. (1908) 30, 1140. U.S. Pat. No. 2,710,853 discloses polyimides based upon pyromellitic acid. Polyimides based upon BPDA are disclosed in U.S. Pat. No. 4,247,443. The use of both BPDA and ODA in the preparation of polyimide polymers is disclosed in U.S. Pat. No. 4,290,936. Tim Tanunina, et al [Plast. Massy (9) 45-7, 1975 (in Russian)], describe polyimide copolymers prepared from 4,4'-diaminodiphenylether (ODA) and pairs of the following dianhydrides, pyromellitic dianhydrides (I);

3,3,4,4'-tetracarboxydiphenyl oxide (II); 3,3',4,4'-benzophenone tetracarboxylic acid (III); and 3,3',4,4'-diphenylsulfide tetracarboxylic acid (IV). The pairs of dianhydrides studied were II and III, I and II, and III and IV. The article discusses the glass transition temperature and densities of the copolymers formed, and compares them to the characteristics of homopolyimides.

Japanese Patent number SHO 63 [1988]-264121 discloses gas separation membranes prepared from polyimide polymers. The polyimides in question are copolymers containing ODPA and BPDA coupled with a variety of diamines including ODA and para-phenylenediamine.

Polyimides are used for wire insulation in certain specialized applications such as aircraft and spacecraft. Polyimides are also used in tape automated bonding (TAB) of semiconductor devices. In TAB semiconductor packaging, a thin sheet of copper is bonded to a polyimide film. The copper is etched to form leads and the semiconductor is then attached to the polyimide film. The leads on the TAB film may then be attached to the semiconductor. The TAB technology allows each chip to have a greater number of leads, and to be connected to the circuit board without having to drill holes through the board. In addition, TAB chips require less vertical space than conventional chips, and therefore, allow more compact circuitry. U.S. Pat. No. 4,063,993 discloses specific methods for bonding semiconductor leads to a tape and also discloses the use of polyimides as the basis of such a tape.

SUMMARY OF THE INVENTION

Polyimide copolymers of the following formulas are disclosed: The first is a copolyimide of the recurring structure

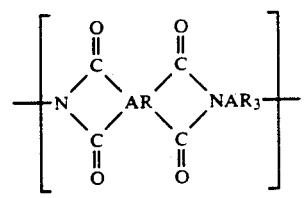

wherein AR may be either $AR_1$ or $AR_2$, wherein $AR_1$ is represented by the following formula:

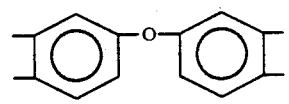

and wherein $AR_2$ is represented by the following formula:

provided that the molar ratio between $AR_1$ and $AR_2$ is in the range from 3:1 to 1:3, and wherein $AR_3$ is selected from the group consisting of

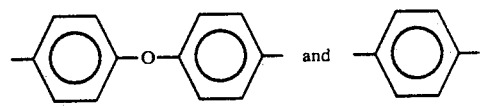

The second is a block copolyimide in which the following two recurring structures exist as blocks wherein block 1 is

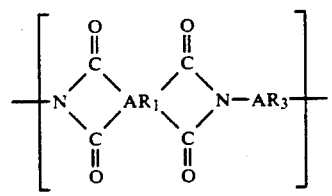

where $AR_1$ is

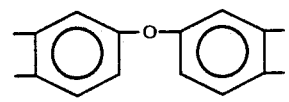

wherein block 2 is

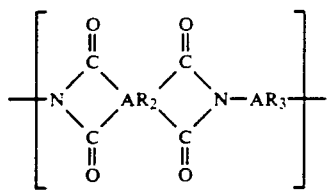

where AR$_2$ is

provided that the molar ratio of block 1 to block 2 is in the range of 3:1 to 1:3, and wherein AR$_3$ is selected from the group consisting of

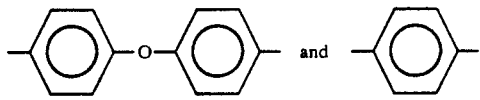

These polyimides have unexpected properties which are useful in various electronic applications.

DETAILED DESCRIPTION OF THE INVENTION

The copolyimides of this invention are formed from ODA or p-phenylene diamine as the amine component and a mixture of ODPA and BPDA as the anhydride component. The copolyimides of this invention are prepared with a single diamine component. This diamine may be either ODA or para-phenylene diamine.

Such copolymers may be formed by two methods. In the first method, mixtures of ODPA in BPDA may be reacted with a diamine to form polyimide copolymers. In the second method of preparing the copolymers, ODPA and BPDA are reacted individually with the diamine to form polyamic acids. The polyamic acids are then mixed and treated further to form the polyimide copolymer. In most cases equimolar amounts of diamine and dianhydride are used. Occasionally, it is desirable to prevent the polyamic acid from becoming too viscous. Control of viscosity may be accomplished by using a slight excess of the diamine and using an acid anhydride such as phthalic anhydride as an end capping reagent. The copolyimides which are the subject of this invention may be prepared with dianhydrides in the following range of molar values:

| ODPA | BPDA |
|------|------|
| 0.75 | 0.25 |
| 0.50 | 0.50 |
| 0.25 | 0.75 |

In the first step of the reaction, the single dianhydrides are added to a solution of the diamine in a dipolar aprotic solvent. Depending on the method chosen, a mixture of dianhydrides is added to a single diamine solution or the dianhydrides are added individually to separate diamine solutions. Illustrative of the dipolar aprotic solvents which may be used are dimethyl acetamide, dimethyl formamide, or dimethyl sulfoxide, hexamethylphosphoramide, N-methylpyrrolidone, and tetramethyl urea. The preferred solvent is dimethyl acetamide. The reaction between the diamine and the dianhydride is conducted at room temperature with stirring. The inherent viscosity of the polyamic acid solution is measured. Inherent viscosity is determined by measuring the viscosity of a 0.5% solution using a capillary viscometer. This viscosity is an indirect measure of the molecular weight of the polymer and, therefore, the extent of polymerization.

At this stage of the reaction, the product is a polyamic acid. When the copolymer is formed from a mixture of two dianhydrides, the polyamic acid solution is ready, without further treatment, for imidization. On the other hand, if it has been elected to react the individual dianhydrides with the diamine to form individual polyamic acids, the polyamic acids may now be mixed and the mixture subjected to the imidization reaction.

The polyamic acids are poured into the desired form. For example, the polyamic acid solution may be spread on a plate. Finally, the polyamic acid is subjected to curing. The initial step in curing is running a stream of an inert gas, such as nitrogen, over the formed polyamic acid in order to evaporate some of the solvent. When the formed polyamic acid is tack-free, it is then heated gradually from room temperature up to a maximum temperature of 400° C. or below. The temperature rise may be interrupted at intermediate temperatures and the object held at a given temperature before the temperature is allowed to increase to the maximum temperature. The preferred method is to allow the temperature to rise to 100° C., hold it at that temperature for one hour, allow the temperature to rise to 200° C., and hold it there for an hour, and, finally, to allow the temperature to rise to 300° C., and hold it at that temperature for an hour. There are three major changes which take place during the curing process. Most of the remainder of the solvent is lost, the polyamic acid releases water to form a polyimide, and chain extension takes place. When the copolymer is formed by mixing and curing two polyamic acids, a block copolymer is formed.

Alternatively, chemical imidization may be accomplished using methods such as that described by M. L. Wallach [Journal of Polymer Science, Part A-2; Vol. 6, 953-960 (1968)]. In this method the polyamic acid is heated with a mixture of an acid anhydride, such as acetic anhydride, and a tertiary amine, such as pyridine, as a basic catalyst. Wallach states that this method should yield a polyimide film which is essentially the same molecular weight as the polyamic acid. Accordingly, his method of chemical imidization is not expected to yield the block copolyimides of this invention, in the case where pre-formed polyamic acids are mixed prior to imidization. Other chemical imidization methods, similar to that disclosed by Wallach, may also be used.

One important property of the polyimides of this invention is their high comparative tracking index. The comparative tracking index is measured by a standard method (ASTM D 3638-77 which is incorporated herein by reference). In summary, the method involves placing electrodes on the material to be tested and adding one drop per second of an aqueous electrolyte solution between the electrodes. The test apparatus is designed to cause tracking, that is, the formation of carbonaceous paths or tracks near the electrodes. When these tracks are sufficiently established to conduct appreciable current, the material is said to have failed. The numerical value of the voltage which causes failure with the application of fifty or more drops electrolyte is arbitrarily called the comparative tracking index. This method is an accelerated test which, at relatively low test voltages, provides comparison of the performance of insulating materials under wet and contaminated conditions. The polyimides of this invention have unexpectedly high comparative tracking indexes.

The polyimides of this invention have good electrical properties and, accordingly, may be used as insulating material. The preferred method of using the polyimides of this invention as insulators is to coat the electrically conductive object with the polyamic acid solution and curing the composition directly on the object to be insulated. By this means, the insulating layer of polyimide forms directly on the object to be insulated. The object to be insulated may be of any shape. For example, round wires, flat conductors, conductive sheets, circuit boards and semiconductor circuit chips may be insulated using the copolyimides of this invention. Even objects of irregular shape may be insulated using these materials. Obviously, only those materials which can withstand the curing process may be insulated using the copolyimides of this invention.

Another property of the polyimides of this invention is their tensile modulus. To measure the modulus, a sample of the plastic is subjected to stress. The tensile modulus is defined as the slope of the initial linear portion of the load extension response (stress strain) wave.

The polyimides of this invention are also useful as a plastic base material for use in tape automated bonding (TAB) electrical chip packaging. Such tape generally consists of a conductive layer and a non-conductive layer. The conductive layer is generally copper. Polyimides are frequently used as the non-conductive layer. A polyimide may be attached to copper with an adhesive. In some applications, the adhesive is not used. In preparing the final product, the conductive layer is etched to form leads and the semiconductor device is attached to these leads. Finally, the semiconductor device is encapsulated in a suitable resin.

EXAMPLE 1

8.00 g (0.04 moles) of 4,4'-oxydianiline (ODA) was dissolved in 113.8 g of dimethyl acetamide. To the resulting solution was added a mixture of 6.204 g (0.02 moles) of ODPA and 5.884 g (0.02 moles) of BPDA. The mixture was stirred at room temperature for 3.5 hours and allowed to stand overnight. The inherent viscosity of the resulting polyamic acid solution (diluted to 0.5%) was 0.993. The polyamic acid solution was cast on glass plates using a doctor blade set at 20 mil. The film on the plate was dried under a stream of nitrogen gas until it was tack-free. The coated plates were then heated to 100° C. for one hour, 200° C. for one hour, and 300° C. for one hour. The product was a polyimide film. The glass transition temperature of this polyimide was 235° C. The comparative tracking index, measured by the ASTM method cited above, was 200 volts.

EXAMPLE 2

Two solutions of ODA were prepared. Each contained 2.002 g (0.01 moles) of ODA. To one solution was added 3.102 g (0.01 moles) of ODPA; to the other was added 2.942 g (0.01 moles) of BPDA. Each of these solutions was stirred for 3.5 hours and allowed to sit overnight. The resulting polyamic acid solutions were mixed. The mixed polyamic acid solutions had an inherent viscosity of 1.47. A polyimide film was formed, as in Example 1, from the mixed polyamic acid solutions. The polyimide film had a comparative tracking index of 175, measured by the ASTM method cited above.

EXAMPLE 3

25.025 g (0.125 moles) of ODA were dissolved in 358 grams of dimethyl acetamide. A mixture of 9.179g (0.0312 moles) of BPDA and 29.066 g (0.0937 moles) of oxydiphthalic dianhydride was added to the solution. The procedure of Example 1 was followed to produce the polyimide film. The comparative tracking index, as measured by the ASTM method, was 150, a glass transition point of 260° C., a tensile modulus of 576,500 PSI and a dielectric constant of 3.64 at 1 KHZ.

EXAMPLE 4

25.025 g (0.125 moles) of ODA were dissolved in 356 grams of dimethyl acetamide. A mixture of 18.39 g (0.0625 moles) of BPDA and 19.39 g (0.0625 moles) of ODPA were added to the solution. The procedure of Example 1 was followed to produce a polyimide film. The comparative tracking index, as measured by the ASTM method, was 150, the glass transition temperature was 265° C., the tensile modulus was 543,700 PSI and the dielectric constant was 3.55 at 1 KHZ.

EXAMPLE 5

25.025 g (0.125 moles) of ODA were dissolved in 353 grams of dimethyl acetamide. A mixture of 27.57 g (0.0937 moles) of BPDA and 9.678 g (0.0312 moles) of ODPA were added to the solution. The procedure of Example 1 was followed to produce a polyimide film. The comparative tracking index, as measured by the ASTM method, was 150, the glass transition temperature was 270° C., the tensile modulus was 599,300 PSI and the dielectric constant was 3.48 at 1 KHZ.

EXAMPLE 6

16.34 g (0.1511 moles) of p-phenylene diamine were dissolved in 348 g of dimethyl acetamide. A mixture of 33.10 g (0.1125 moles) of BPDA, 11.63 g (0.0375 moles) of ODPA and 0.33 g (0.0022 moles) of phthalic acid were added to the solution. The procedure of Example 1 was followed to produce a polyimide film. The comparative tracking index, as measured by the ASTM method, was 150, the tensile modulus was 1,208,000 PSI, and the dielectric constant was 3.39 at 1 KHZ.

We claim:

1. A block copolyimide in which the following two recurring structures exist as blocks wherein block 1 is

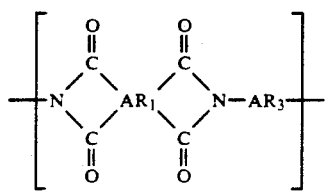

where $AR_1$ is

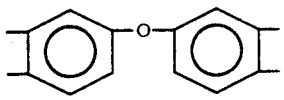

wherein block 2 is

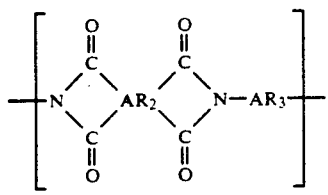

where AR₂ is

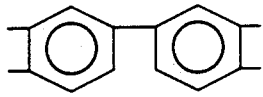

provided that the molar ratio of block 1 to block 2 is in the range of 3:1 to 1:3 and where AR₃ is selected from the group consisting of

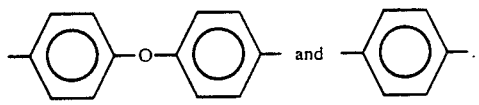

2. A copolyimide according to claim 1 in which the molar ratio of block 1 to block 2 is in the range of 2:1 to 1:2.

3. A copolyimide according to claim 1 in which the molar ratio of block 1 to block 2 is in the range of 1.5:1 to 1:1.5.

4. A copolyimide according to claim 1 in which the molar ratio of block 1 to block 2 is 1:1.

5. An article comprising an electrically conductive material coated with a copolyimide according to claim 1.

6. An article comprising an electrically conductive material coated with a copolyimide according to claim 2.

7. An article comprising an electrically conductive material coated with a copolyimide according to claim 3.

8. An article comprising an electrically conductive material coated with a copolyimide according to claim 4.

9. An article in the form of a tape comprising an electrically conductive layer which may be fashioned into electrically conductive leads suitable for attachment to a semiconductor device, a layer of a copolyimide according to claim 1, and optional bonding materials between said layers.

10. An article in the form of a tape comprising an electrically conductive layer which may be fashioned into electrically conductive leads suitable for attachment to a semiconductor device, a layer of a copolyimide according to claim 2, and optional bonding materials between said layers.

11. An article in the form of a tape comprising an electrically conductive layer which may be fashioned into electrically conductive leads suitable for attachment to a semiconductor device, a layer of a copolyimide according to claim 3 and optional bonding materials between said layers.

12. An article in the form of a tape comprising an electrically conductive layer which may be fashioned into electrically conductive leads suitable for attachment to a semiconductor device, a layer of a copolyimide according to claim 4, and optional bonding materials between said layers.

* * * * *